United States Patent
Debroy et al.

(10) Patent No.: US 12,211,641 B1
(45) Date of Patent: Jan. 28, 2025

(54) SYSTEM AND METHOD FOR SKYRMION BASED LOGIC DEVICE

(71) Applicant: Ceremorphic, Inc., San Jose, CA (US)

(72) Inventors: Sanghamitra Debroy, Hyderabad (IN); Akshaykumar Salimath, Hyderabad (IN); Venkat Mattela, San Jose, CA (US)

(73) Assignee: CEREMPRPHIC, INC., San Jose, CA (US)

( * ) Notice: Subject to any disclaimer, the term of this patent is extended or adjusted under 35 U.S.C. 154(b) by 453 days.

(21) Appl. No.: 17/734,061

(22) Filed: Apr. 30, 2022

(51) Int. Cl.
| | |
|---|---|
| *H01F 41/30* | (2006.01) |
| *B82Y 10/00* | (2011.01) |
| *B82Y 25/00* | (2011.01) |
| *H01F 10/32* | (2006.01) |
| *H10N 52/01* | (2023.01) |
| *H10N 52/85* | (2023.01) |

(52) U.S. Cl.
CPC ....... *H01F 41/303* (2013.01); *H01F 10/3286* (2013.01); *H01F 41/305* (2013.01); *H10N 52/01* (2023.02); *H10N 52/85* (2023.02); *B82Y 10/00* (2013.01); *B82Y 25/00* (2013.01)

(58) Field of Classification Search
None
See application file for complete search history.

(56) References Cited

U.S. PATENT DOCUMENTS

| | | | | |
|---|---|---|---|---|
| 9,653,136 | B2* | 5/2017 | Cros | H10N 50/85 |
| 11,700,001 | B1* | 7/2023 | Debroy | H03K 19/18 |
| | | | | 326/104 |
| 2008/0100345 | A1* | 5/2008 | Bratkovski | B82Y 10/00 |
| | | | | 977/933 |
| 2022/0366955 | A1* | 11/2022 | Wang | H10N 50/20 |

* cited by examiner

*Primary Examiner* — Jany Richardson
(74) *Attorney, Agent, or Firm* — Minisandram Law Firm; Raghunath S. Minisandram

(57) ABSTRACT

A system and method for a logic device is disclosed. A first input nanotrack, a second input nanotrack and an output nanotrack are disposed over a substrate along a first axis. Output nanotrack is disposed between the input nanotracks. Each nanotrack have a first end and a second end. A connector nanotrack connects the first input nanotrack, the second input nanotrack, and the output nanotrack. An input value is defined at a first end of the input nanotracks by selectively nucleating a skyrmion at the first end. Presence of the skyrmion is indicative of a first value and absence of the skyrmion indictive of a second value. Nucleated skyrmion moves to the second end of the output nanotrack when a charge current is passed along the first axis. Presence of the skyrmion at the second end indicates an output value of the first value.

20 Claims, 4 Drawing Sheets

| INPUT A | INPUT B | OUTPUT |
|---------|---------|--------|
| 0 | 0 | 0 |
| 0 | 1 | 1 |
| 1 | 0 | 1 |
| 1 | 1 | 0 |

SYSTEM AND METHOD FOR SKYRMION BASED LOGIC DEVICE

RELATED APPLICATION

None

TECHNICAL FIELD

The present invention relates generally to logic devices and more specifically, to skyrmion based logic devices.

DESCRIPTION OF RELATED ART

The rapid development of information technology has ensured a continuous increase of the logic density over the past years. As the VLSI technology and associated CMOS based logic devices reach their limits, further increase in logic device density capacity can only be accomplished through novel approaches.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. A first input nanotrack, a second input nanotrack and an output nanotrack are disposed over the substrate, along a first axis. The output nanotrack is disposed between the first input nanotrack and the second input nanotrack. Each nanotrack have a first end and a second end. At least one connector nanotrack is disposed to selectively connect the first input nanotrack, the second input nanotrack and the output nanotrack. An input value is defined at the first end of the first input nanotrack and second input nanotrack by selectively nucleating a skyrmion at first end of the first input nanotrack and second input nanotrack. Presence of the skyrmion is indicative of a first value and absence of the skyrmion indictive of a second value. A charge current is selectively passed through the substrate to selectively move the nucleated skyrmion towards the second end of the output nanotrack. The charge current is passed along the first axis. The presence of the skyrmion is sensed about the second end of the output nanotrack. An output value is concluded as the first value when the presence of the skyrmion is sensed.

In another embodiment, a system is disclosed. A first input nanotrack, a second input nanotrack and an output nanotrack are disposed over the substrate, along a first axis. The output nanotrack is disposed between the first input nanotrack and the second input nanotrack. Each nanotrack have a first end and a second end. At least one connector nanotrack is disposed to selectively connect the first input nanotrack, the second input nanotrack and the output nanotrack. An input value is defined at the first end of the first input nanotrack and second input nanotrack by selectively nucleating a skyrmion at first end of the first input nanotrack and second input nanotrack. Presence of the skyrmion is indicative of a first value and absence of the skyrmion indictive of a second value. A charge current is selectively passed through the substrate to selectively move the nucleated skyrmion towards the second end of the output nanotrack. The charge current is passed along the first axis. The presence of the skyrmion is sensed about the second end of the output nanotrack. An output value is concluded as the first value when the presence of the skyrmion is sensed.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example logic device will be described. The specific construction and operation of the adaptive aspects of various elements of the example logic device is described.

Figures 1, 2A:
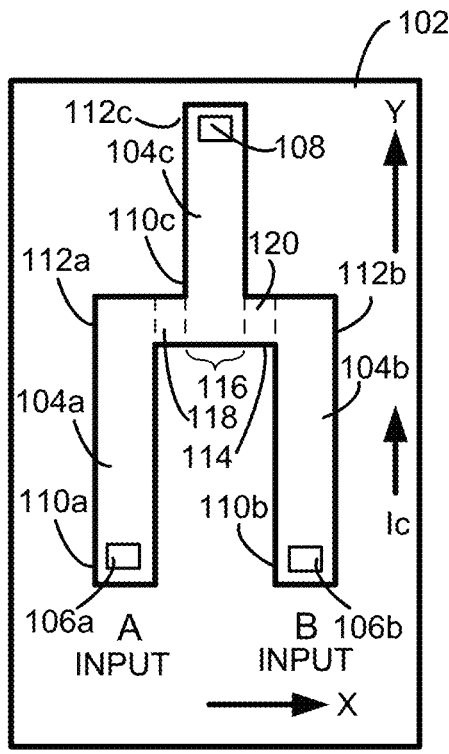
FIG. 1 shows an example logic device, according to one aspect of the present disclosure.
FIG. 2A shows an example truth table for a two input logic device, according to one aspect of the present disclosure.

FIG. 1 shows an example logic device 100. The logic device 100 includes a substrate 102, a plurality of nanotracks 104a, 104b, and 104c, a plurality of nucleating devices 106a, and 106b, and a sense device 108. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. The thickness of the substrate 102 may be of the order of about 5 nm to about 10 nm. As one skilled in the art appreciates, the substrate 102 may be deposited on a base layer (not shown). In some examples, base layer may be a silicon wafer.

The plurality of nanotracks 104a, 104b, and 104c are disposed over the substrate. The plurality of nanotracks 104a, 104b, and 104c are composed of ferromagnetic material. In some examples, a suitable cobalt-nickel alloy or other similar materials (for example, nickel iron alloy, or cobalt, iron, nickel alloys) that provide high magnetic permeability may be used. In one example, the plurality of nanotracks 104a, 104b, and 104c are substantially rectangular in shape and are disposed substantially parallel to each other, along an axis Y. Each nanotrack has a first end and a second end. For example, nanotrack 104a has a first end 110a and a second end 112a. The nanotrack 104b has a first end 110b and a second end 112b. The nanotrack 104c has a first end 110c and a second end 112c. Nanotrack 104b is disposed between the nanotrack 104a and 104c. Sometimes nanotrack 104a is referred to as first input nanotrack 104a, nanotrack 104b is referred to as second input nanotrack 104b, and nanotrack 104c is referred to as output nanotrack 104c. The output nanotrack 104c is spaced apart and disposed about the second end 112a of the first input nanotrack 104a and the second end 112b of the second input nanotrack 104b. In one example, a width of the plurality of nanotracks 104a, 104b, and 104c is about 80-100 nanometers. Further, a space between the first input nanotrack and the second input nanotrack is about 90-110 nanometers. In one example, a thickness of the nanotrack is about 1-3 nanometers.

A connector nanotrack 114 is selectively disposed between the first input nanotrack 104a and the second input nanotrack 104b. The connector nanotrack 114 couples the second end 112a of the first input nanotrack 104a, first end 110c of the output nanotrack 104c and the second end 112b of the second input nanotrack 104b. As previously described, space between the first input nanotrack 104a and the second input nanotrack 104b is of the order of about 90-110 nanometers. The space between the first input nanotrack 104a and the second input nanotrack 104b results in a length of the connector nanotrack 114 in the order of about 90-110 nanometers. In one example, the width of connector nanotracks is of the order of about 80-100 nanometers. In one example, the output nanotrack 104c is disposed about a central portion 116 of the connector nanotrack 114. A length of the central portion 116 of the connector nanotrack 114 is about the same as the width of the output nanotrack 104c. In some examples, this is of the order of about 80-100 nanometers. This results in a smaller left portion 118 of the connector nanotrack 114 which couples to the first input nanotrack 104a, as compared to the length of the central portion 116. Similarly, this results in a smaller right portion 120 of the connector nanotrack 114 which couples to the second input nanotrack 104b, as compared to the length of the central portion 116.

Nucleating devices 106a, and 106b are disposed about the first end of the nanotracks 104a, and 104b respectively. For example, nucleating device 106a is disposed about the first end 110a of the first input nanotrack 104a. Nucleating device 106b is disposed about the first end 110b of the second input nanotrack 104b. In one example, the nucleating devices are magnetic tunnel junction devices. By selectively passing current through the nucleating devices, a skyrmion is nucleated about the first end of the input nanotracks. In one example, presence of the skyrmion is indicative of a first value, for example, a value of 1 and absence of the skyrmion is indicative of a second value, for example, a value of 0. In this example, the nucleating device 106a sets the input value for input A, and nucleating device 106b sets the input value for input B.

Skyrmions are topologically protected magnetic configurations observed in magnets lacking inversion symmetry. Their topological protection comes from nonzero winding number. This result in their robustness against thermal fluctuations and disorder. Magnetic skyrmions are technologically intriguing due to their small size (typically less than 10 nm), ultra low currents required for their manipulation, for example, selective movement inside the nanotracks. They have large annihilation energy barrier (annihilation energy Ea>50 $k_{BT}$, where $k_B$ is Boltzmann constant and T is temperature . . . This large annihilation energy barrier can result in lifetimes greater than 10 years, generally suitable for device applications.

Skyrmions are stabilized by the presence of Dzyaloshinskii-Moriya interactions (DMIs) observed in chiral magnets or at the ferromagnet/heavy metal layer (FM-HM layer) interface. The interfacial spin orbit interaction give rise to DMI interaction at the FM-HM layer interface and is responsible for the stabilization of skyrmion bits in the ferromagnet. The same interfacial spin orbit interaction is responsible for spin Hall effect in the heavy metal layer. Further, the proposed design the skyrmions are confined to the ferromagnet nanotracks due to edge repulsion. The skyrmion bits are nucleated by passing current through the magnetic tunnel junction positioned at each of the input nodes. The skyrmions are propagated through the spin orbit torque resulting from the x-polarized electrons accumulated at the ferromagnet/heavy metal layer interface when the charge current Ic flows in the y-direction in the heavy metal layer.

In general, magnetic skyrmion is a stable nano sized spin configurations with topological property that is locally nucleated by injection of spin-polarized current and displaced in the ferromagnet nanotrack by current-induced spin torques.

The sense device 108 is selectively disposed about the second end 112b of the output nanotrack 104b. The sense device 108 is configured to sense the presence of the skyrmion about the second end of the middle nanotrack 104b. In one example, presence of the skyrmion is indicative of a first value, for example, a value of 1 and absence of the skyrmion is indicative of a second value, for example, a value of 0. In some examples, the sense device 108 is a magnetic tunnel junction device.

When a charge current Ic is passed through the substrate 102, nucleated skyrmions are configured to travel towards the second end of the nanotrack. In one example, the charge current Ic is passed along the Y axis and the skyrmions will move along the Y axis. The skyrmion move along the Y axis, due to the spin orbit torque resulting from polarized electrons accumulated about the ferromagnet-heavy metal layer interface when the charge current Ic flows in the heavy metal layer. Further, the skyrmions are confined to the nanotracks due to edge repulsion. In one example, the skyrmions have a tendency to be biased to shift along the −X direction, as they move towards the second end of the nanotrack, along the Y direction. Further details about the selective movement of the nucleated skyrmions along the nanotracks will be later described with reference to FIGS. 2B to 2H.

FIG. 2A shows an example truth table 200 for a two input logic device, according to an example of this disclosure. Referring now to table 200, Input A is shown in column 202, input B is shown in column 204, and output is shown in column 206. In this example, the truth table 200 corresponds to an exclusive OR configuration of the logic device. For example, referring to rows 208 and 210, when only one of the inputs A or B is a 0, the output is 1. Similarly, referring to row 212, if both the inputs are a 1, the output is a 0. Similarly, referring to row 214 when both the inputs are a zero, output is a 0. As previously described, presence of a skyrmion at the input is indicative of a value of 1 and absence of a skyrmion at the input is indicative of a value of 0. Further, presence of a skyrmion at the output is indicative of a value of 1 and absence of a skyrmion at the output is indicative of a value of 0. Now, referring to FIGS. 2B to 2H, selective movement of the skyrmion from the first end of the nanotrack to the second end of the nanotrack is now described, for various combinations of input values.

Figure 2B:
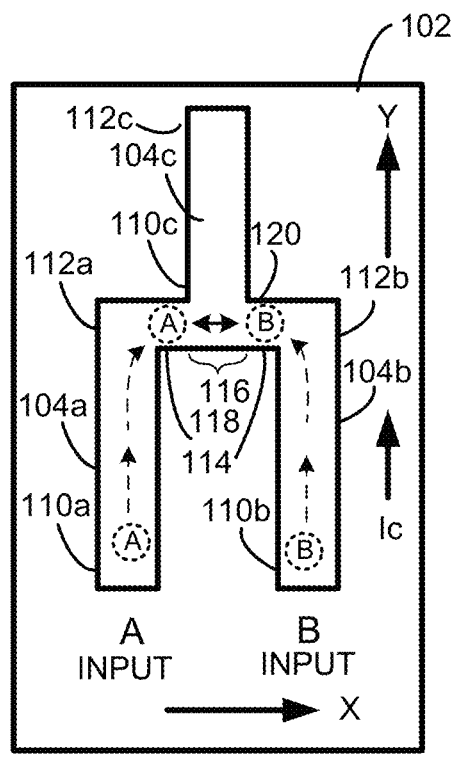
FIGS. 2B to 2D show selective movement of the skyrmion from the first end of the nanotrack to the second end of the nanotrack, for various combinations of input values shown in the truth table of FIG. 2A, according to one aspect of the present disclosure.

Now, referring to FIG. 2B, logic device 100 is shown with input values A, and B set as 1, 1 respectively, at the first end of the first input nanotrack 104*a* and the second input nanotrack 104*b*. As previously described, a skyrmion is selectively nucleated at inputs A, and B. Nucleated skyrmion at input A, and B are shown as skyrmion A, and skyrmion B. When charge current Ic is passed in the +Y direction, the skyrmions will move towards the second end of the nanotracks, along the Y axis. As previously described, the skyrmions have a tendency to be biased to move in the −X direction, as they move towards the second end of the nanotrack.

As skyrmion A and skyrmion B moves towards the second end, they both approached the connector nanotrack 114. Skyrmion A will be repelled by the edges of the first input nanotrack 104*a* and is pushed towards the left portion 118 of the connector nanotrack 114. In the meantime, skyrmion B moves towards the second end 112*b* of the second input nanotrack 104*b*. Skyrmion B will be repelled by the edges of the second input nanotrack 104*b* and is pushed towards the right portion 120 of the connector nanotrack 104*b*. As both skyrmoin A and skyrmion B try to enter the central portion 116 of the connector nanotrack 114, they repel each other and neither of the skyrmion A and skyrmion B enter the output nanotrack 104*c*. When the charge current Ic is stopped, both skyrmion A and skyrmion B will be disposed about the connector nanotrack 114. And, no skyrmion is present at the second end 112*c* of the output nanotrack 104*c*.

As previously described, the output is measured by the sensor disposed about the second end 112*c* of the output nanotrack 104*c*. In this example, we notice that no skyrmion is disposed at the second end 112*c* of the output nanotrack 104*c*. As there is no skyrmion is present at the second end 112*c* of the output nanotrack 104*c*, the sensor will detect the absence of the skyrmion and yield a value of 0. This result is consistent with the result expected according to row 212 of the truth table 200 of FIG. 2A.

Figure 2C:
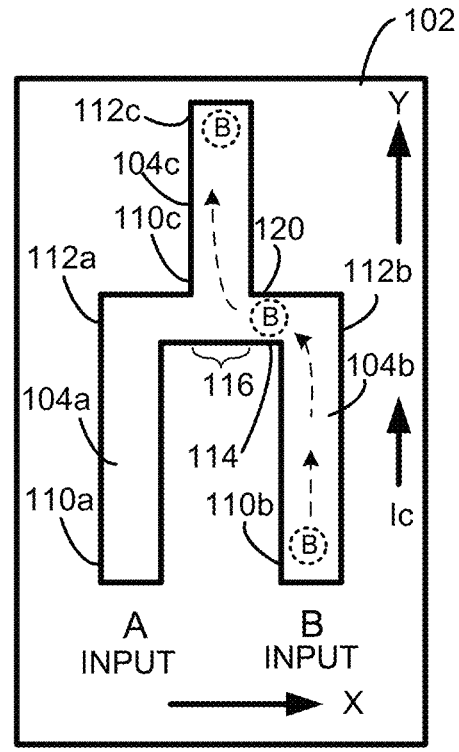

Now, referring to FIG. 2C, logic device 100 is shown with input values A, and B are set as 0, 1 respectively, at the first end of the first input nanotrack 104*a* and the second input nanotrack 104*b*. As previously described, a skyrmion is selectively nucleated at input B. Nucleated skyrmion at input B is shown as skyrmion B. When charge current Ic is passed in the +Y direction, the skyrmion B will move towards the second end 112*b* of the second input nanotrack 104*b*, along the Y axis. As previously described, the skyrmions have a tendency to be biased to move in the −X direction, as they move towards the second end of the nanotrack.

As skyrmion B moves towards the second end, it approaches the connector nanotrack 114. As skyrmion B is biased to move towards the left nanotrack, skyrmion B move from the connector nanotrack 104*b* towards the output nanotrack 104*c*, via the connector nanotrack 114. As input A is zero, no corresponding skyrmion is moving in the first input nanotrack 104*a*. Therefore, skyrmion B will shift from second input nanotrack 104*b* to output nanotrack 104*c* through the connector nanotrack 114 and continues to move towards the second end 112*c* of the output nanotrack 104*c* and eventually reach the second end 112*c* of the output nanotrack 104*c*.

As previously described, the output is measured by the sensor disposed about the second end 112*c* of the output nanotrack 104*c*. In this example, we notice that the skyrmion B is now disposed at the second end 112*c* of the output nanotrack 104*c*. As there is a skyrmion present at the second end 112*c* of the output nanotrack 104*c*, the sensor will detect the presence of the skyrmion and yield a value of 1. This result is consistent with the result expected according to row 210 of the truth table 200 of FIG. 2A.

Figure 2D:
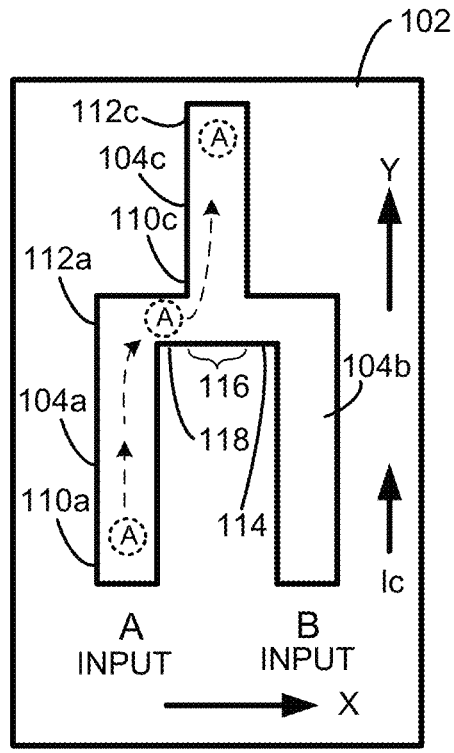

Now, referring to FIG. 2D, logic device 100 is shown with input values A, and B set as 1, 0 respectively, at the first end of the first input nanotrack 104*a* and second input nanotrack 104*b*. As previously described, a skyrmion is selectively nucleated at input A. Nucleated skyrmion at input A is shown as skyrmion A. When charge current Ic is passed in the +Y direction, the skyrmion A will move towards the second end 112*a* of the first input nanotrack 104*a*, along the Y axis. About the second end 112*a* of the first input nanotrack 104*a*, skyrmion A will be repelled by the edges of the first input nanotrack 104*a* and is pushed towards the left portion 118 of the connector nanotrack 114.

As skyrmion B moves into the left portion 118 of the connector nanotrack 114 As input B is zero, no corresponding skyrmion is moving in the second input nanotrack 104*b*. Therefore, skyrmion A will shift from first input nanotrack 104*a* to output nanotrack 104*c* through the connector nanotrack 114 and continues to move towards the second end 112*c* of the output nanotrack 104*c* and eventually reaches the second end 112*c* of the output nanotrack 104*c*.

As previously described, the output is measured by the sensor disposed about the second end 112*c* of the output nanotrack 104*c*. In this example, we notice that the skyrmion B is now disposed at the second end 112*c* of the output nanotrack 104*c*. As there is a skyrmion present at the second end 112*c* of the output nanotrack 104*c*, the sensor will detect the presence of the skyrmion and yield a value of 1. This result is consistent with the result expected according to row 208 of the truth table 200 of FIG. 2A.

When the input values A, and B are set as 0, 0 respectively, at the first end of the first input nanotrack 104*a* and the second input nanotrack 104*b*, no skyrmions are present at the first input nanotrack 104*a* and the second input nanotrack 104*b*. When the charge current Ic is passed, there will be no skyrmions at the second end of the output nanotrack 104*c*. As no skyrmion is detected at the output, the sensor will detect the absence of the skyrmion and yield a value of 0. This result is consistent with the result expected according to row 214 of the truth table 200 of FIG. 2A.

Figure 3A:
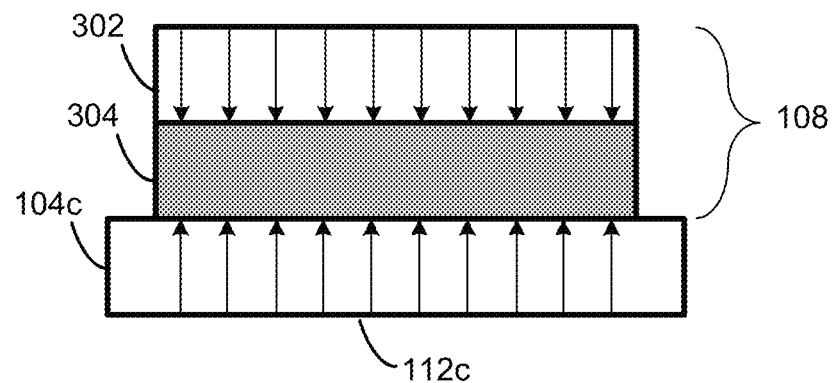
FIGS. 3A and 3B show structure and operation of an example sensor, according to one aspect of the present disclosure.
Figure 3B:
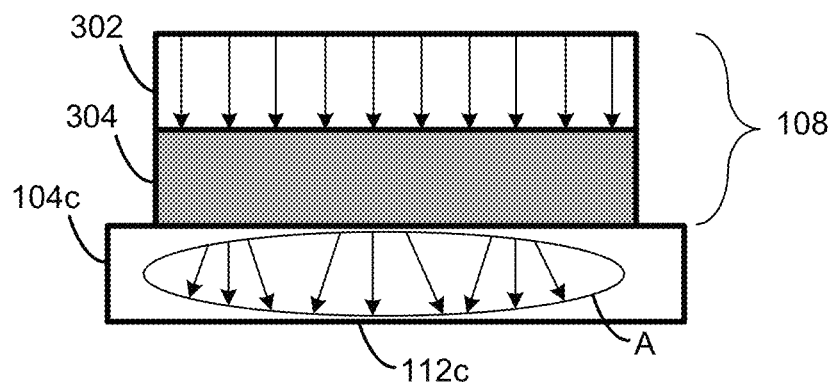

Now, referring to FIGS. 3A and 3B, example structure and operation of the sensor 108 is described. Referring to FIG. 3A, the sensor 108 includes an output ferromagnetic layer 302 and a spacer layer 304. The sensor 108 is disposed over the output nanotrack 104*c*, about the second end 112*c*. The magnetic orientation of the output ferromagnetic layer 302 is pinned such that the direction of the magnetic orientation of the output ferromagnetic layer 302 (as shown by arrows in the output ferromagnetic layer 302) is antiparallel to that of the ferromagnetic output nanotrack 104*c* (as shown by arrows in the ferromagnetic output nanotrack 114*c*). This combination structure of the output ferromagnetic layer 302, spacer layer 304 and the second end 112*c* portion of the output nanotrack 104*c* acts as a magnetic tunnel junction stack. In some examples, the output ferromagnetic layer 302 may be a CoFe alloy or a CoFeB alloy. The spacer layer 304 may be a MgO (Magnesium Oxide) layer. In some examples, a thickness of the output ferromagnetic layer 302 may be of the order of about 1-2 nanometers. In some examples, the spacer layer 304 may be of the order of about 1 nanometer.

When no skyrmion is present about the second end 112*c* of the output nanotrack 104*c*, due to the antiparallel magnetic orientation, the resistance across the magnetic tunnel junction will be high. In one example, this indicates the absence of the skyrmion about the second end 112*c* of the output nanotrack 104*c*.

Now referring to FIG. 3B, when a skyrmion, for example, skyrmion A is present about the second end 112*c* of the output nanotrack 104*c*, direction of some of the magnetic orientation inside the skyrmion will be parallel or quasi-parallel to the pinned direction of magnetic orientation inside the output ferromagnetic layer 302 (as shown by arrows inside the skyrmion A). Due to the quasi-parallel magnetic orientation, the resistance across the magnetic tunnel junction will be low. In one example, this indicates the presence of the skyrmion about the second end 112*c* of the output nanotrack 104*c*. In some examples, a high resistance may be of the order of about 20K Ohms and a low resistance may be of the order of about 10K Ohms.

Figure 4:
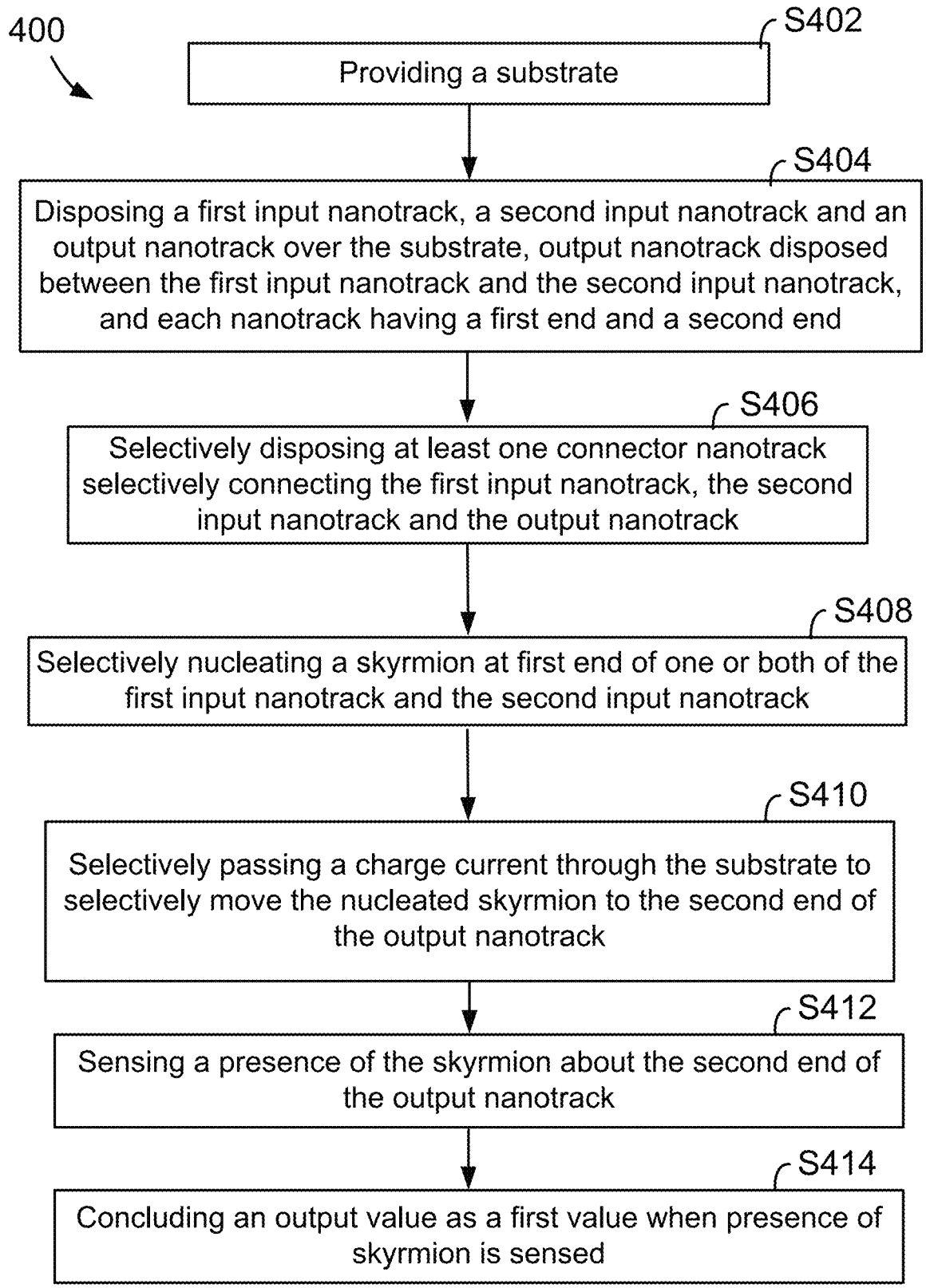
FIG. 4 shows an example flow diagram, according to one aspect of the present disclosure.

Now, referring to FIG. 4, an example flow diagram 400 is described. In block S402, a substrate is provided. For example, substrate 102 is provided.

In block S404, a first input nanotrack, a second input nanotrack, and an output nanotrack are disposed over the substrate. The output nanotrack is disposed between the first input nanotrack and the second input nanotrack. Each of the nanotracks have a first end and a second end. For example, first input nanotrack 104*a*, second input nanotrack 104*b* and output nanotrack 104*c* are provided. Each nanotrack has a first end and a second end. For example, first input nanotrack 104*a* has a first end 110*a* and a second end 112*a*. The second input nanotrack 104*b* has a first end 110*b* and a second end 112*b*. The output nanotrack 104*c* has a first end 110*c* and a second end 112*c*.

In block S406, at least one connector nanotrack is selectively disposed to connect the first input nanotrack, the second input nanotrack and the output nanotrack. For example, connector nanotrack 114 is disposed between the first input nanotrack 104*a* and the second input nanotrack 104*b*.

In block S408, a skyrmion is selectively nucleated at the first end of one or both of the first input nanotrack and second input nanotrack. Various combinations of selectively nucleating one or more skyrmions was previously described with reference to FIGS. 2B-2D. For example, referring to FIG. 2B, logic device 100 was shown with input values A, and B set as 1, 1 respectively, at the first end of the first input nanotrack 104*a* and second input nanotrack 104*b*. As previously described, a skyrmion is selectively nucleated at inputs A, and B. Nucleated skyrmion at input A, and B are shown as skyrmion A, and skyrmion B. When charge current Ic is passed in the +Y direction, the skyrmions will move towards the second end of the input nanotracks, along the Y axis.

In block S410, a charge current Ic selectively passed through the substrate to selectively move the nucleated skyrmion to the second end of the output nanotrack 104*c*. As previously described with reference to FIGS. 2B-2D, when charge current Ic is passed in the +Y direction, the skyrmions will move towards the second end of the output nanotrack 104*c*, along the Y axis.

In block S412, a presence of the skyrmion is sensed about the second end of the output nanotrack. For example, presence of the skyrmion is sensed about the second end 112*c* of the output nanotrack 104*c*.

In block S414, concluding an output value as a first value, when the presence of the skyrmion is sensed. For example, presence of the skyrmion about the second end of the output nanotrack 104*c* is indicative of an output of first value.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
providing a substrate;
disposing a plurality of nanotracks along a first axis, with at least a first input nanotrack,
a second input nanotrack and an output nanotrack over the substrate, the output nanotrack disposed between the first input nanotrack and the second input nanotrack, each nanotrack having a first end and a second end;
disposing at least one connector nanotrack selectively connecting the first input nanotrack, the second input nanotrack and the output nanotrack;
selectively defining an input value at the first end of the first input nanotrack and the second input nanotrack by selectively nucleating a skyrmion at the first end of one or both of the first input nanotrack and the second input nanotrack, wherein presence of the skyrmion indicative of a first value and absence of the skyrmion indictive of a second value;
selectively passing a charge current through the substrate to selectively move the nucleated skyrmion towards the second end of the output nanotrack, charge current passed along the first axis;
sensing the presence of the skyrmion about the second end of the output nanotrack; and
concluding an output value as the first value when the presence of the skyrmion is sensed.

2. The method of claim 1, wherein, at least one skyrmion in one of the first nanotrack and the second nanotrack moves to the output nanotrack, via the connector nanotrack.

3. The method of claim 1, wherein, the charge current is passed through the substrate in a first direction, the nucleated skyrmion selectively moves in the first direction due to a spin orbit torque generated in a second direction orthogonal to the first direction.

4. The method of claim 1, further including,
selectively disposing at least one nucleating device adjacent the first end of the first input nanotrack and the first end of the second input nanotrack; and
selectively energizing the nucleating device to selectively nucleate skyrmion in one or both of the first input nanotrack and the second input nanotrack to indicate the input value.

5. The method of claim 1, further including,
selectively disposing at least one sensing device adjacent the second end of the output nanotrack to selectively sense the presence of the skyrmion about the second end of the output nanotrack.

6. The method of claim 1, further including, disposing the at least one connector nanotrack about the second end of the first input nanotrack, the second end of the second input nanotrack and the first end of the output nanotrack.

7. The method of claim 6, wherein, the connector nanotrack provides a path for the nucleated skyrmion to move through the output nanotrack.

8. The method of claim 1, wherein the skyrmion selectively moving from the first end to the second end of one of the first input nanotrack and the second input nanotrack selectively shifts to the output nanotrack through the connector track, unless both the first input nanotrack and the second input nanotrack have nucleated skyrmion.

9. The method of claim 8, wherein the movement of the skyrmion is constrained by the walls of the nanotracks.

10. The method of claim 5, the sensing device includes an output ferromagnetic layer and a spacer layer, the spacer layer disposed between the output ferromagnetic layer and the second end of the output nanotrack, the output ferromagnetic layer, the spacer layer and a portion of the second end of the output nanotrack forming a magnetic tunnel junction stack.

11. A system, including:
a substrate;
a plurality of nanotracks along a first axis, with at least a first input nanotrack, a second input nanotrack and an output nanotrack disposed over the substrate, the output nanotrack disposed between the first input nanotrack and the second input nanotrack, each nanotrack having a first end and a second end;
at least one connector nanotrack is disposed to selectively connecting the first input nanotrack, the second input nanotrack and the output nanotrack;
an input value at the first end of the first input nanotrack and the second input nanotrack is selectively defined by selectively nucleating a skyrmion at the first end of one or both of the first input nanotrack and the second input nanotrack, wherein presence of the skyrmion indicative of a first value and absence of the skyrmion indictive of a second value;
a charge current is selectively passed through the substrate to selectively move the nucleated skyrmion towards the second end of the output nanotrack, shift current passed along a second axis, second axis substantially perpendicular to the first axis;
the presence of the skyrmion is sensed about the second end of the output nanotrack; and
an output value is concluded as the first value when the presence of the skyrmion is sensed.

12. The system of claim 11, wherein, at least one skyrmion in one of the first nanotrack and the second nanotrack moves to the output nanotrack, via the connector nanotrack.

13. The system of claim 11, wherein, the charge current is passed through the substrate in a first direction and the nucleated skyrmion selectively moves in the first direction due to a spin orbit torque generated in a second direction orthogonal to the first direction.

14. The system of claim 11, further including,
at least one nucleating device is selectively disposed adjacent the first end of the first input nanotrack and the first end of the second input nanotrack; and
the nucleating device is selectively energized to selectively nucleate skyrmion in one or both of the first input nanotrack and the second input nanotrack to indicate the input value.

15. The system of claim 11, further including,
at least one sensing device is selectively disposed adjacent the second end of the output nanotrack to selectively sense the presence of the skyrmion about the second end of the output nanotrack.

16. The system of claim 11, wherein the at least one connector nanotrack is disposed about the second end of the first input nanotrack, the second end of the second input nanotrack and the first end of the output nanotrack.

17. The system of claim 16, wherein, the connector nanotrack provides a path for the nucleated skyrmion to move through the output nanotrack.

18. The system of claim 11, wherein the skyrmion selectively moves from the first end to the second end of one of the first input nanotrack and the second input nanotrack, and selectively shifts to the output nanotrack through the connector track, unless both the first input nanotrack and the second input nanotrack have nucleated skyrmion.

19. The system of claim 11, wherein the movement of the skyrmion is constrained by the walls of the nanotracks.

20. The system of claim 15, the sensing device includes an output ferromagnetic layer and a spacer layer, the spacer layer disposed between the output ferromagnetic layer and the second end of the output nanotrack, the output ferromagnetic layer, the spacer layer and a portion of the second end of the output nanotrack together form a magnetic tunnel junction stack.

* * * * *